(12) United States Patent
Hung et al.

(10) Patent No.: US 9,875,811 B2
(45) Date of Patent: Jan. 23, 2018

(54) METHOD AND DEVICE FOR READING A MEMORY

(71) Applicant: MACRONIX INTERNATIONAL CO., LTD., Hsinchu (TW)

(72) Inventors: Chun Hsiung Hung, Hsinchu (TW); Shih Chou Juan, Taoyuan (TW); Nai-Ping Kuo, Hsinchu (TW); Yi Chun Liu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/994,472

(22) Filed: Jan. 13, 2016

(65) Prior Publication Data

US 2017/0200510 A1    Jul. 13, 2017

(51) Int. Cl.
*G11C 29/50* (2006.01)

(52) U.S. Cl.
CPC .................... *G11C 29/50* (2013.01)

(58) Field of Classification Search
CPC .................................................. G11C 11/5642
USPC ..................................................... 365/185.18
See application file for complete search history.

(56) References Cited

U.S. PATENT DOCUMENTS

| 2008/0285341 | A1* | 11/2008 | Moschiano | G11C 16/3418 365/185.02 |
|---|---|---|---|---|
| 2009/0073763 | A1 | 3/2009 | Hosono | |
| 2010/0195389 | A1* | 8/2010 | Kim | G11C 16/3418 365/185.03 |
| 2012/0236636 | A1* | 9/2012 | Nawata | G11C 16/28 365/185.2 |
| 2013/0297894 | A1* | 11/2013 | Cohen | G06F 3/0679 711/154 |
| 2014/0036592 | A1* | 2/2014 | Miki | G11C 16/04 365/185.17 |
| 2015/0078094 | A1* | 3/2015 | Nagashima | G11C 16/26 365/185.21 |
| 2015/0089183 | A1* | 3/2015 | Bains | G06F 12/06 711/202 |

FOREIGN PATENT DOCUMENTS

| TW | I410975 B | 10/2010 |
|---|---|---|
| TW | 2016/03046 A | 1/2016 |
| WO | WO 2009/133553 | 11/2009 |

\* cited by examiner

*Primary Examiner* — Min a Huang
(74) *Attorney, Agent, or Firm* — Finnegan, Henderson, Farabow, Garrett & Dunner LLP (57) ABSTRACT

A method for reading data from memory cells of a target word line in a semiconductor memory includes determining a disturbance status of the target word line. The disturbance status reflects a disturbance of a neighboring word line on the memory cells of the target word line. The method further includes determining a read voltage for the target word line according to the disturbance status of the target word line and applying the read voltage to the memory cells of the target word line.

17 Claims, 4 Drawing Sheets

FIG. 1A 
After programming page 3

FIG. 1B 
After programming page 4

FIG. 1C 
After programming page 5

FIG. 1D 
After programming page 6

FIG. 1E 
After programming page 8

METHOD AND DEVICE FOR READING A MEMORY

TECHNOLOGY FIELD

The disclosure relates to a method for reading a semiconductor memory and, more particularly, to a method for adjusting a read threshold voltage based on disturbance status.

BACKGROUND

In a semiconductor memory, the threshold voltage of a memory cell can be changed by changing the amount of electric charge stored in a storage layer of the memory cell. Therefore, by storing a different amount of electric charge, the memory cell can store different data. For example, for a single-bit memory cell, the state without electric charge in the storage layer represents a logic 0 or 1 while the state with electric charge in the storage layer represents a logic 1 or 0. As another example, in a multi-bit memory cell, such as a two-bit memory cell, different states represent logics 00, 01, 10, and 11, respectively, by storing different amounts of charge. The memory cell in different states has different threshold voltages corresponding to the different states. Therefore, to determine the data stored in the memory cell, a read voltage higher than the threshold voltage of the memory cell in a lower-threshold state and lower than that in a higher-threshold state is applied to the memory cell to determine whether the memory cell has been programmed to the higher-threshold state.

The process for storing date into memory cells of a semiconductor memory is also referred to as "programming." During a programming process of a semiconductor memory, a programming voltage is applied to certain memory cells to inject electric charge into the storage layer of each of these memory cells, to program these memory cells to a higher-threshold state. However, since memory cells in a semiconductor memory are arranged closely to each other, programming one memory cell may influence a neighboring memory cell, thus accidentally changing the threshold voltage of the neighboring memory cell. This phenomenon is also referred to as "program disturbance."

For example, in a semiconductor memory including single-bit memory cells, the memory cells are programmed page by page, where each page includes memory cells coupled to the same word line. In the present disclosure, the term "word line" also refers to the collection of memory cells coupled to that word line. Thus, a memory cell coupled to a word line is also referred to as a memory cell of or belonging to that word line. The memory cells in a page fall into two groups after being programmed, one having lower threshold voltages and the other one having higher threshold voltages. In practice, the memory cells in the same group may not have exactly the same threshold voltage, but have threshold voltages within a certain range. For example, the memory cells in the low-threshold state may have threshold voltages within the range of $V_{L1}$ to $V_{L1}$, while the memory cells in the high-threshold state may have threshold voltages within the range of $V_{H1}$ to $V_{H2}$. Whether a memory cell is in the low-threshold state or in the high-threshold state (and thus whether the memory cell stores a logic 0 or a logic 1) can be determined by applying a read voltage $V_R$ that is higher than $V_{L2}$ but lower than $V_{H1}$ and determining whether the memory cell is on or off.

However, due to program disturbance, when one page is programmed, a neighboring page may be affected. Thus, in the neighboring page, the threshold voltage range of the memory cells in the low-threshold state may shift to the range of $V_{L1'}$-$V_{L2'}$ and the threshold voltage range of the memory cells in the high-threshold state may shift to the range of $V_{H1'}$-$V_{H2'}$. If the previously chosen read voltage $V_R$ is smaller than $V_{L2'}$, then some of the memory cells that are actually in the low-threshold state will be incorrectly determined to be in the high-threshold state. Thus, in this case, to more accurately determine the state of the memory cells, a different read voltage $V_{R'}$ that is higher than $V_{L2'}$ but lower than $V_{H1'}$ should be used.

Table 1 and FIGS. 1A-1E schematically illustrate another example involving a semiconductor memory including two-bit memory cells. Table 1 shows an exemplary programming scheme in the semiconductor memory including two-bit memory cells. In this example, one block of the semiconductor memory is illustrated. The memory cells in this block are separated into 128 groups, each of which belongs to one word line (WL), numbered as 0, 1, . . . 127, as shown in Table 1. Each of the memory cells can store a least significant bit (LSB) and a most significant bit (MSB). The LSBs or the MSBs of the same word line form a page and thus the semiconductor memory includes a total of 256 pages. During the programming process, the semiconductor memory is programmed page by page and, as shown in Table 1, the pages are numbered as 0, 1, . . . 255, according to the order of programming. For example, page 0 includes the LSBs of WL 0 and is first programmed, page 1 includes the LSBs of WL 1 and is then programmed, and page 255 includes the MSBs of WL 127, and is last programmed.

TABLE 1

| Page Program Order | | |
|---|---|---|
| WL | LSB | MSB |
| 0 | 0 | 2 |
| 1 | 1 | 4 |
| 2 | 3 | 6 |
| 3 | 5 | 8 |
| 4 | 7 | ⋮ |
| ⋮ | ⋮ | 252 |
| 126 | 251 | 254 |
| 127 | 253 | 255 |

FIGS. 1A-1E schematically show, as an example, the distribution of memory cells of WL 2 after pages 3, 4, 5, 6, and 8 are programmed, respectively. In the present disclosure, the distribution of memory cells of a word line refers to a plot of the number of memory cells as a function of threshold voltage. For example, in FIGS. 1A-1E, the horizontal axis represents the threshold voltage and the vertical axis represents the number of memory cells having a certain threshold voltage. Referring again to Table 1, pages 3 and 6 belong to WL 2, while pages 4, 5, and 8 belong to one of the neighboring word lines (WL 1 and WL 3) of WL 2, and are programmed after one or two pages in WL 2 are programmed.

Figure 1A:
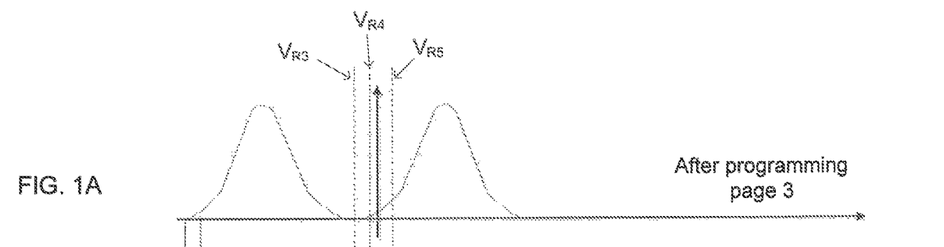
FIGS. 1A-1E schematically show a distribution of memory cells on WL 2 in Table 1 after programming.
Figure 1B:
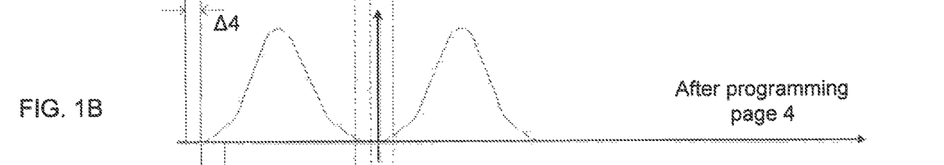
Figure 1C:
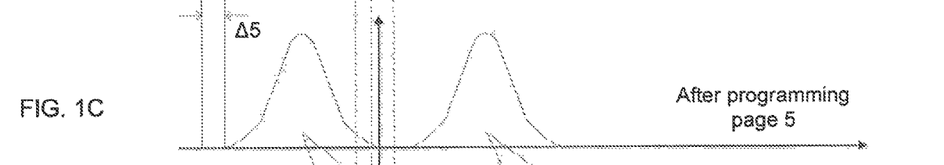

As shown in FIG. 1A, after page 3 (LSBs on WL 2) is programmed, the memory cells on WL 2 are separated into two groups. At this time, the ideal read voltage for determining the state of a memory cell in WL 2 is $V_{R3}$. As shown in FIG. 1B, after page 4 is programmed, the distribution of WL 2 memory cells is shifted by a disturbance Δ4 due to the influence of the programming of page 4 on the WL 2 memory cells. Such a disturbance is also referred to as a "program disturbance." Due to this shift, if $V_{R3}$ is still used as the read voltage after page 4 is programmed, some of the WL 2 memory cells that are actually in the low-threshold state will be incorrectly determined as being in the high-threshold state. Therefore, to reduce error, a different ideal read voltage $V_{R4}$ should be used at this time for determining the state of the memory cells on WL 2. Similarly, as shown in FIG. 1C, programming page 5 introduces a disturbance Δ5 into the distribution of the WL 2 memory cells and the ideal read voltage at this time becomes $V_{R5}$.

Figure 1D:
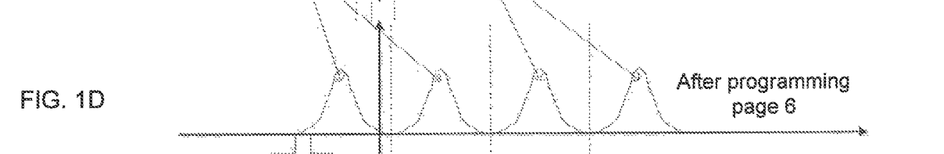
Figure 1E:
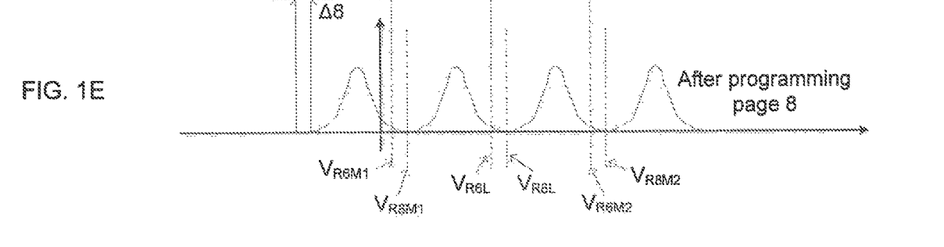

Further, as shown in FIG. 1D, after page 6 (MSBs on WL 2) is programmed, the memory cells on WL 2 are further separated into four groups, representing logic 00, 01, 10, and 11, respectively. At this time, the ideal read voltages for determining the state of a memory cell on WL 2 are $V_{R6L}$, $V_{R6M1}$, and $V_{R6M2}$, respectively, where $V_{R6L}$ is used to determine the least significant bit stored in the memory cell and $V_{R6M1}$ and $V_{R6M2}$ are used to determine the most significant bit stored in the memory cell. After page 8 is programmed, as shown in FIG. 1E, the distribution of WL 2 memory cells are further shifted by a disturbance Δ8 due to the influence of the programming of page 8 on the WL 2 memory cells. As a consequence, the ideal read voltages become $V_{R8L}$, $V_{R8M1}$, and $V_{R8M2}$, respectively.

As can be seen from the above-described examples, if the same read voltage(s) are used at different stages of programming a semiconductor memory, some memory cells may be "mis-read," and thus the bit-error rate may be high.

SUMMARY

In accordance with the disclosure, there is provided a method for reading data from memory cells of a target word line in a semiconductor memory. The method includes determining a disturbance status of the target word line. The disturbance status reflects a disturbance of a neighboring word line on the memory cells of the target word line. The method further includes determining a read voltage for the target word line according to the disturbance status of the target word line and applying the read voltage to the memory cells of the target word line.

Also in accordance with the disclosure, there is provided a semiconductor memory including a memory cell area and a control portion. The memory cell area includes first memory cells of a target word line and second memory cells of a neighboring word line that is neighboring to the target word line. The control portion is configured to determine a disturbance status of the target word line. The disturbance status reflects a disturbance of a neighboring word line on the memory cells of the target word line. The control portion is further configured to determine a read voltage for the target word line according to the disturbance status of the target word line and apply the read voltage to the first memory cells.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a semiconductor device having output compensation.

Hereinafter, embodiments consistent with the disclosure will be described with reference to the drawings. Wherever possible, the same reference numbers will be used throughout the drawings to refer to the same or like parts.

Figure 2:
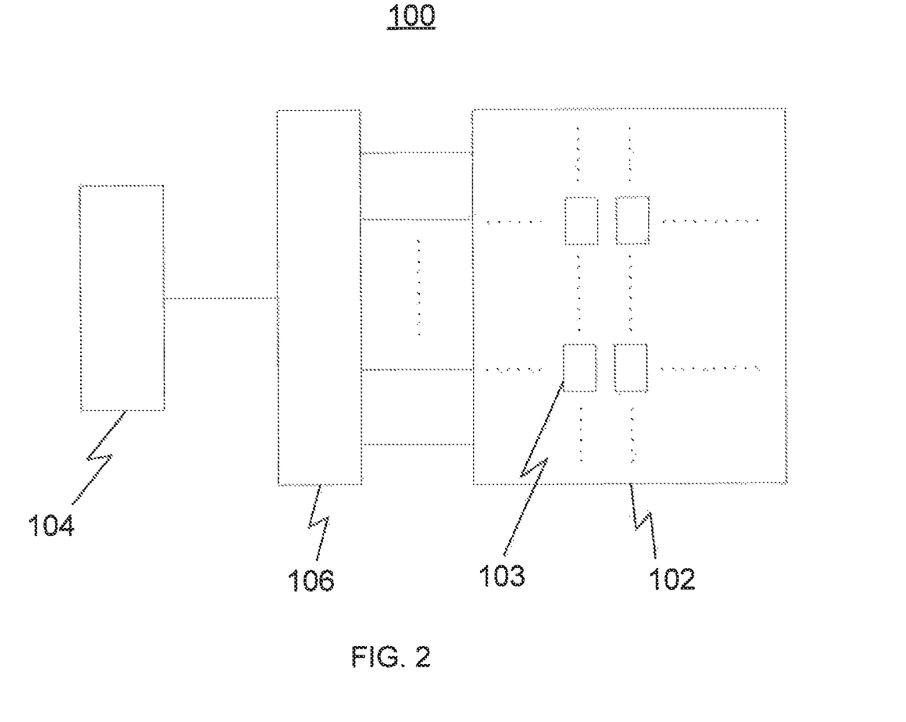
FIG. 2 schematically shows a semiconductor memory according to an exemplary embodiment.

FIG. 2 schematically shows an exemplary semiconductor memory 100 consistent with embodiments of the present disclosure. The semiconductor memory 100 includes a memory cell region 102, a controller 104, and a decoder 106. The memory cell region 102 includes a plurality of memory cells 103 arranged in an array and for storing data. The memory cells 103 may be, for example, non-volatile memory cells. According to the present disclosure, the memory cell region 102 also includes a plurality of word lines and a plurality of bit lines for accessing the memory cells. Accordingly, the memory cells 103 are organized as a plurality of groups, each of which is coupled to one of the word lines. As discussed above, memory cells 103 coupled to one word line are also referred to as memory cells of that word line or memory cells belonging to that word line, and the term "word line" may also be used to refer to the collection of the memory cells coupled to that word line.

The controller 104 is configured to control the operations of the semiconductor memory 100, including, e.g., programming the memory cells 103 and reading data from the memory cells 103. For example, the controller 104 generates control commands, such as read commands, to be sent to the decoder 106. The decoder 106 is coupled between the controller 104 and the memory cells 103 in the memory cell region 102, and is configured to, e.g., decode and execute the control commands received from the controller 104 to, e.g., write data into or read data from, the memory cells 103. The controller 104 and the decoder 106 may be collectedly referred to as a control portion of the semiconductor memory 100. In some embodiments, the control portion may further include other components that are associated with controlling the semiconductor memory 100.

In some embodiments, the semiconductor memory 100 may further include a storage, such as a non-transitory computer-readable storage medium, that stores instructions that, when executed by the semiconductor memory 100, cause the semiconductor memory 100 to execute certain operations, such as methods consistent with embodiments of the present disclosure. In some embodiments, the storage may be part of the controller 104. In some embodiments, the semiconductor memory 100 may be coupled to such a storage, i.e., the storage may be external to the semiconductor memory 100.

Figure 3:
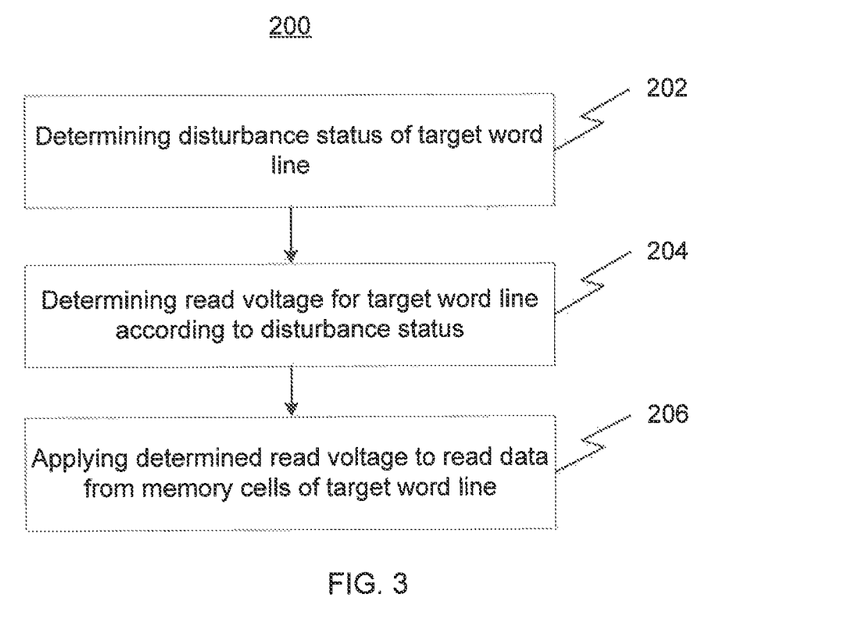
FIG. 3 is a flow chart of a method for reading data stored in the semiconductor memory according to an exemplary embodiment.

FIG. 3 is a flow chart of an exemplary method 200 consistent with embodiments of the present disclosure for reading data stored in the semiconductor memory 100. The method 200 can be performed to determine the read voltage $V_R$ for a target word line by determining a disturbance status of the target word line, i.e., the program disturbance or disturbances the neighboring word lines may have caused on the distribution of memory cells of the target word line. Thus, the disturbance status of the target word line reflects the influence of one or more neighboring word lines on the target word line. As described above, a neighboring word line can have different programming states. Each of the different programming states of the neighboring word line can cause a different influence on the target word line, resulting in a different read voltage for the target word line.

As shown in FIG. 3, at 202, the semiconductor memory 100 determines the disturbance status of the target word line. At 204, the semiconductor memory 100 determines a read voltage for the target word line according to the disturbance status. At 206, the semiconductor memory 100 applies the determined read voltage to read data from the memory cells 103 of the target word line.

Generally, in a normal situation, a block in a semiconductor memory is fully programmed before a read operation is performed, i.e., disturbances of neighboring word lines on the target word line have already occurred. For example, for the exemplary block illustrated in Table 1, in the normal situation, the disturbances Δ4, Δ5, and Δ8 would have occurred before a read operation is to be performed on that block. The disturbance status in this normal situation is also referred to herein as a "full disturbance status." According to the present disclosure, a normal read voltage can be applied to the target word line when the target word line is in the full disturbance status.

On the other hand, sometimes a read operation may be performed before one or more of the neighboring word lines are programmed, i.e., when not all of the disturbances from the neighboring word lines exist. The disturbance status of the target word line under which some of the disturbances from the neighboring word lines exist is also referred to herein as a "partial disturbance status." Similarly, the disturbance status of the target word line under which none of the disturbances from the neighboring word lines exist is also referred to herein as a "no disturbance status." According to the present disclosure, an alternative read voltage can be applied to the target word line in the partial disturbance status or the no disturbance status. The value of the alternative read voltage can be determined according to the disturbance status.

In the present disclosure, a read mode in which the normal read voltage is applied is also referred to as a normal read mode, and a reading operation in the normal read mode is also referred to as a normal reading. Similarly, a read mode in which the alternative read voltage is applied is also referred to as an alternative read mode, and a reading operation in the alternative read mode is also referred to as an alternative reading.

In some embodiments, the disturbance status of the target word line can be determined by checking the programming state of the one or more neighboring word lines. The programming state of a word line indicates at what stage of the programming process the memory cells of the word line are. For example, for a single-bit semiconductor memory, the programming state of a word line may indicate whether the memory cells of the word line have been programmed. As another example, for a two-bit semiconductor memory, the programming state of a word line may be a state in which the memory cells of the word line have not been programmed at all, a state in which the least significant bit (LSB) page of the word line has been programmed but the most significant bit (MSB) page of the word line has not been programmed, or a state in which both the LSB and MSB pages of the word line have been programmed.

As noted above, the programming of the memory cells 103 in the semiconductor memory 100 is controlled by the controller 104. That is, the controller 104 generates and sends control commands to the decoder 106, which in turn decodes and executes the commands. The control commands include programming commands that are configured to program memory cells 103 in the memory cell region 102. In some embodiments, the pages in the memory cell region 102 are programmed sequentially and thus the controller 104 knows the last page that was programmed. In this scenario, the determination of the programming state of the neighboring word lines can be conducted by the controller 104 according to the record in the controller 104. Consequently, the controller 104 may issue one or more special commands to instruct using the alternative read mode for the target word line. Such special commands may be associated with one or more read commands for reading memory cells 103 of one or more target word lines.

Figure 4A:
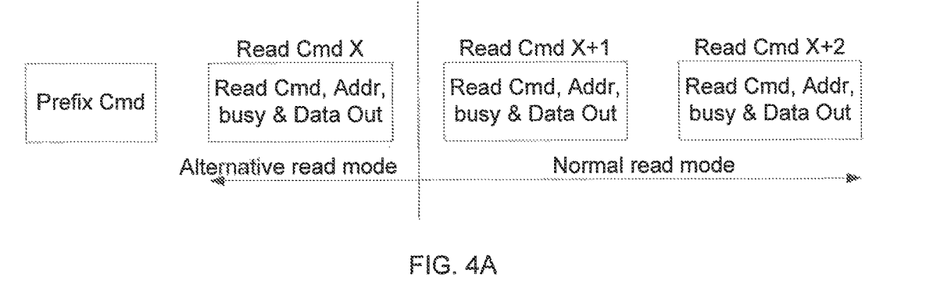
FIGS. 4A and 4B schematically show command sequences according to exemplary embodiments.
Figure 4B:
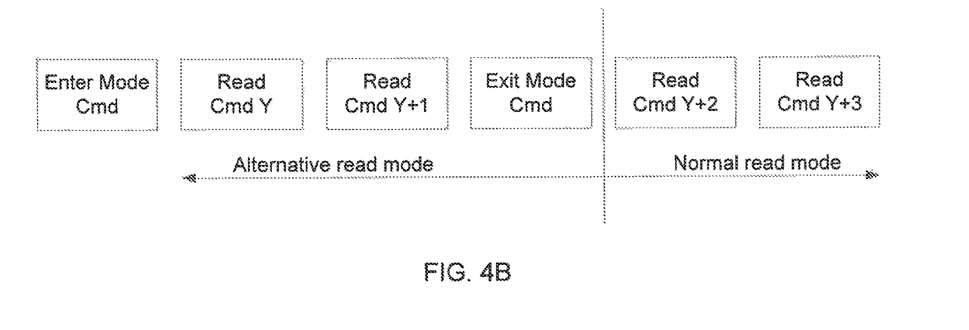

For example, FIGS. 4A and 4B schematically show two exemplary command sequences consistent with embodiments of the present disclosure. As discussed above, the controller 104 determines whether an alternative read mode is needed for a target word line according to the programming state of one or more neighboring word lines. In some embodiments, after determining that the alternative read mode should be applied to a target word line, the controller 104 generates a prefix command and appends it before the read command for the target word line, as shown in FIG. 4A. In this example, the controller 104 may generate a prefix command for each target word line that needs the alternative reading. After the alternative reading is executed for that target word line, the read mode for following read commands returns to the normal read mode, until the next time that the controller 104 determines a need for the alternative read mode. For example, as shown in FIG. 4A, one prefix command (Prefix Cmd) precedes a read command X. Thus, when receiving the command sequence, the decoder 106 executes the read command X under the alternative read mode. The subsequent read commands generated by the controller 104, i.e., read command X+1 and read command X+2, do not have prefix command preceding thereof, and thus are to be executed under the normal read mode.

Consistent with the present disclosure, various commands can be used as prefix commands for indicating the programming state of the neighboring word line(s). For example, the semiconductor memory 100 may be a two-bit memory, as discussed above. The controller 104 may issue a 0xF1 command as the prefix command to indicate that the MSB page in the neighboring word line that is ahead of the target word line in the order in which pages are programmed, which is also referred to as a previous word line, has not been programmed. Since the pages are programmed in a certain order as shown in Table 1, the disturbance status of the target word line in which the MSB in the previous word line has not been programmed is a no disturbance status. Also, the controller 104 may issue a 0xF2 command as the prefix command to indicate that the MSB page in the previous word line has been programmed but the LSB page in the neighboring word line that follows the target word line, which is also referred to as a next word line, has not been programmed. The disturbance status of the target word line in this scenario is a first partial disturbance status. Further, the controller 104 may issue a 0xF3 command as the prefix command to indicate that the LSB page in the next word line has been programmed but the MSB page in the next word line has not been programmed. The disturbance status of the target word line in this scenario is a second partial disturbance status different from the first partial disturbance status. In accordance with the present disclosure, when the MSB page in the next word line has been programmed, the disturbance status of the word line is a full disturbance status, which does not require an alternative reading, and thus the controller 104 does not issue a prefix command.

In some embodiments, instead of the prefix commands, the controller 104 issues a pair of special commands to indicate that the read command(s) between the pair of special commands need to be executed under the alternative read mode. The pair of special commands include an enter mode command and an exit mode command, as shown in FIG. 4B. In FIG. 4B, the enter mode command and the exit mode command are arranged to bracket a read command Y and a read command Y+1. Therefore, the read command Y and the read command Y+1 need to be executed under the alternative read mode. In contrast, read command Y+2 and read command Y+3 are not bracketed by any enter mode command and exit mode command, and thus can be executed under the normal read mode.

According to the present disclosure, when receiving the command sequence having one or more of the special commands, the decoder 106 determines the read voltage of a target word line according to the command sequence. For example, if the command sequence of FIG. 4A is utilized and a read command for a target word line does not have a prefix command preceding thereof, the decoder 106 determines that the target word line is in the full disturbance status. In this scenario, the decoder 106 determines that normal read voltage(s) should be used for the target word line, i.e., the read operation of the target word line should be executed under the normal read mode. On the other hand, if a read command for a target word line has a prefix command preceding it, the decoder 106 determines that the target word line is in the no disturbance status or the partial disturbance status. In this scenario, the decoder 106 determines that alternative read voltage(s) should be used for the target word line, i.e., the read operation of the target word line should be executed under the alternative read mode. Consistent with the present disclosure, the magnitude of the alternative read voltage(s) to be used can be determined according to the prefix command.

In the examples discussed above, the programming state(s) of the neighboring word line(s), and thus the read voltage of the target word line, are determined by the controller 104 according to the programming scheme. In other embodiments, the disturbance status, and thus the read voltage, of the target word line can be determined using special programming patterns in the memory cell region 102 itself. That is, the read voltage of the target word line can be determined "internally," without the special commands from the controller 104.

Figure 5:
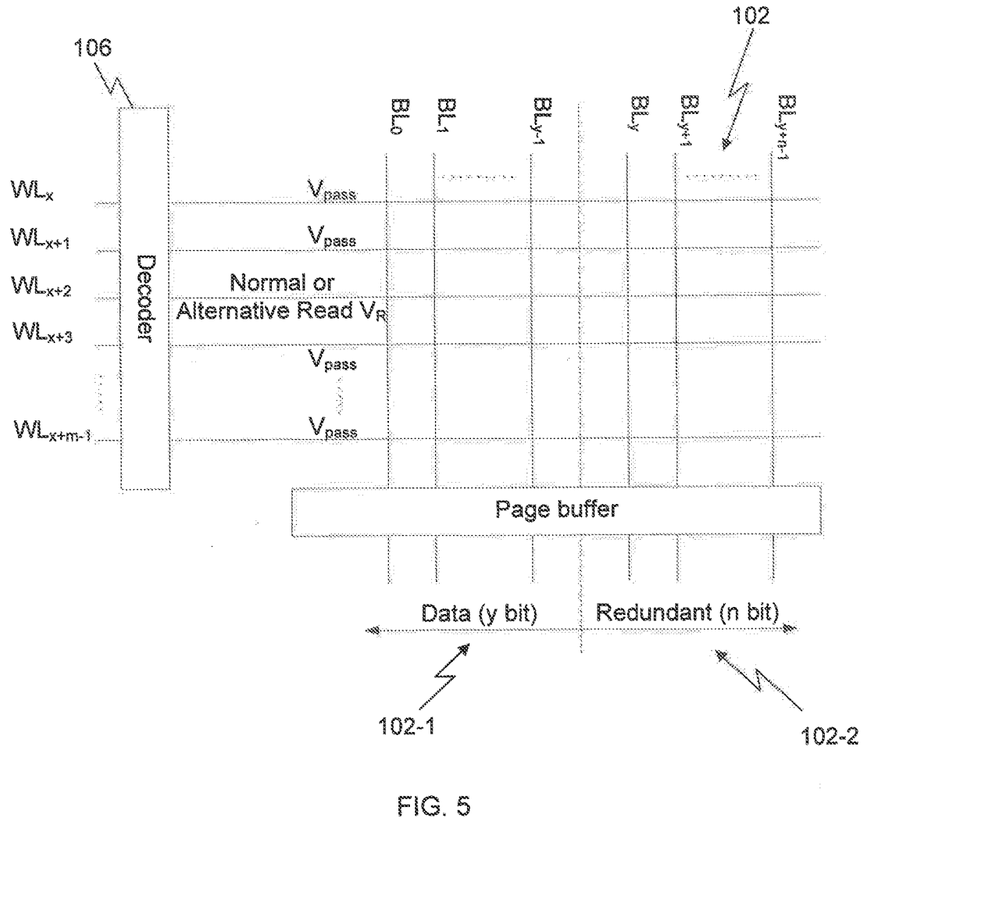
FIG. 5 schematically shows a portion of the semiconductor memory according to an exemplary embodiment.

FIG. 5 schematically shows a portion, such as one block, of the semiconductor memory 100. In the portion shown in FIG. 5, m word lines ($WL_x$, . . . $WL_{x+m-1}$) and y+n bit lines ($BL_0$, . . . $BL_{y-1}$, $BL_y$, $BL_{y+1}$, . . . $BL_{y+n-1}$) are arranged intersecting with each other in the memory cell region 102. Each of the intersection point in FIG. 5 corresponds to one memory cell (not shown). The word lines are coupled with the decoder 106, which applies a read voltage $V_R$ (normal or alternative) to a target word line ($WL_{x+2}$ in the example shown in FIG. 5) and a pass voltage $V_{pass}$ to other word lines.

As shown in FIG. 5, the memory cell region 102 is divided into two areas: a data area 102-1 and a redundant area 102-2. The data area 102-1 includes memory cells corresponding to bit lines $BL_0$, $BL_1$, . . . $BL_{y-1}$, and is configured to store, for example, user data. The memory cells in the data area 102-1 are also referred to as data cells. The redundant area 102-2 includes memory cells corresponding to bit lines $BL_y$, $BL_{y+1}$, . . . $BL_{y+n-1}$, and is configured to store other information, such as information that can be used to determine the disturbance status, and thus the read voltage, of a target word line, as described below. The memory cells in the redundant area 102-2 are also referred to as redundant cells.

In some embodiments, the redundant cells of a word line can be used to store a programmed flag that indicates the programming state of that word line. That is, different flags can be coded into the redundant cells to represent different programming states of the corresponding word line. By reading the programmed flag of a word line, the semiconductor memory 100 can learn about the programming state of the word line. For example, by reading the programmed flag of a neighboring word line of the target word line, the semiconductor memory 100 can determine the programming state of the neighboring word line.

The flag for a word line can be coded into the redundant cells when that word line is being programmed. Various schemes can be used for a flag, such as different numbers of programmed redundant cells and un-programmed redundant cells. In this disclosure, a programmed cell is also referred to as a cell in the programmed state, while an un-programmed cell is also referred to as an erased cell or a cell in the erased state. Therefore, determining the programming state of a word line can be conducted by determining at least one of the number of programmed redundant cells or the number of erased redundant cells. For example, assume the semiconductor memory 100 is a two-bit memory and each word line has 100 redundant cells. A programmed flag of a word line that includes more than 90 programmed redundant cells and less than 10 erased cells can be used to indicate that the word line is in an un-programmed, i.e., erased, state. A programmed flag of the word line that includes more than 40 programmed redundant cells and more than 10 erased redundant cells can be used to indicate that the word line is in an LSB-programmed state, i.e., the state in which the LSB page of the word line has been programmed. A programmed flag of the word line that includes less than 10 programmed redundant cells and more than 90 erased redundant cells can be used to indicate that the word line is in an LSB/MSB-programmed state, i.e., the state in which both the LSB and MSB pages of the word line have been programmed. As another example, a programmed flag of the word line that includes less than 25 programmed redundant cells can be used to indicate that the word line is in the erased state, a programmed flag of the word line that includes 25 or more than 25 but less than 75 programmed redundant cells can be used to indicate that the word line is in the LSB-programmed state, and a programmed flag of the word line that includes 75 or more programmed redundant cells can be used to indicate that the word line is in the LSB/MSB-programmed state.

Figure 6:
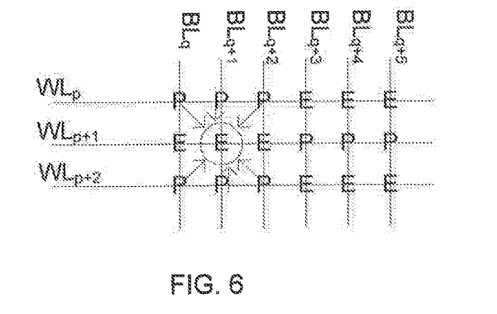
FIG. 6 schematically shows an enlarged portion of a redundant area of the semiconductor memory, illustrating a chessboard-type disturbance sensing pattern according to an exemplary embodiment.

In some embodiments, the disturbance status of the target word line can be determined using a disturbance sensing pattern stored in the redundant cells in the redundant area 102-2. For example, when a word line is being programmed, the redundant cells of that word line are alternately programmed in small groups, such as groups of three redundant cells. Then when a next word line is being programmed, the redundant cells of the next word line are also alternately programmed in small groups but in an inversed scheme. In the present disclosure, a group containing erased redundant cells is also referred to as an erased group and a group containing programmed redundant cells is also referred to as programmed group. This programming scheme results in a pattern having groups of programmed redundant cells and groups of erased redundant cells arranged alternately. Such a pattern is herein referred to as a "chessboard pattern." For example, FIG. 6 schematically shows an enlarged portion of the redundant area 102-2, illustrating an exemplary chessboard pattern consistent with embodiments of the present disclosure. In FIG. 6, three word lines $WL_p$, $WL_{p+1}$, and $WL_{p+2}$, and six bit lines $BL_q$-$BL_{q+5}$, as well as the programming states of the corresponding redundant cells, are shown. A label "P" at an intersection point represents that the corresponding redundant cell is programmed, and a label "E" at an intersection point represents that the corresponding redundant cell is erased.

In the exemplary chessboard pattern shown in FIG. 6, the word lines WL and $WL_{p+2}$ have the same designed programming scheme, i.e., the redundant cells corresponding to bit lines $BL_q$, $BL_{q+1}$, and $BL_{q+2}$, which are also referred to as the $q_{th}$, $(q+1)_{th}$, and $(q+2)_{th}$ redundant cells, respectively, are designed to be in the programmed state and the redundant cells corresponding to bit lines $BL_{q+3}$, $BL_{q+4}$, and $BL_{q+5}$, which are also referred to as the $(q+3)_{th}$, $(q+4)_{th}$, and $(q+5)_{th}$ redundant cells, respectively, are designed to be in the erased state. On the other hand, the word line $WL_{p+1}$, which is between the word lines $WL_p$ and $WL_{p+2}$, has an "inverse" programming scheme, i.e., the $q_{th}$, $(q+1)_{th}$, and $(q+2)_{th}$ redundant cells of the word line $WL_{p+1}$ are designed to be in the erased state and the $(q+3)_{th}$, $(q+4)_{th}$, and $(q+5)_{th}$ redundant cells of the word line $WL_{p+1}$ are designed to be in the programmed state. Due to the influence of neighboring word line(s), a redundant cell designed to be in the erased state may actually appear to be in the programmed state after the programming process finishes.

To determine the influence of the word lines $WL_p$ and $WL_{p+2}$ on the word line $WL_{p+1}$ and thus to determine the disturbance status and the read voltage of the word line $WL_{p+1}$, the $(q+1)_{th}$ redundant cell of the word line $WL_{p+1}$ is sensed to determine the actual programming state thereof. The sensing result is used to determine the influence of the neighboring word lines $WL_p$ and $WL_{p+2}$ on the target word line $WL_{p+1}$ and thus to determine the disturbance status of the target word line. FIG. 6 only shows one period of the sensing pattern, which can be repeated for redundant cells corresponding to other bit lines to form the entire sensing pattern. Each period includes two groups of redundant cells with one group being erased and the other group being programmed. The redundant cell in the middle of each of the erased groups can be sensed and statistics of the sensing results across all erased groups of the target word line can be used to determine the influence of the neighboring word lines and hence the disturbance status of the target word line.

In the example shown in FIG. 6, each group includes three redundant cells. In other embodiments, each group may include other numbers of redundant cells, such as five, seven, or even more redundant cells. Further, in the example shown in FIG. 6, a chessboard pattern is illustrated as an exemplary disturbance sensing pattern. However, other types of patterns that are sensitive to the influence of neighboring word line(s) can also be used.

In some embodiments, wear leveling can be performed on the memory cells 103 in the semiconductor memory 100. Each time the wear leveling is performed, the disturbance sensing pattern may change. For example, the above-described chessboard pattern may toggle every time, i.e., the erased redundant cells become programmed and the programmed redundant cells become erased. As such, the disturbance sensing pattern can be kept "fresh," and thus the determination of the influence of the neighboring word lines can be conducted more accurately.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for reading data from memory cells of a target word line in a semiconductor memory, comprising:
    determining, by a controller portion, a disturbance status of the target word line, the disturbance status reflecting a disturbance of a neighboring word line on the memory cells of the target word line, wherein determining the disturbance status of the target word line includes determining a programming state of the neighboring word line;
    generating, by the controller portion, a command sequence including a read command for the target word line and at least one special command associated with the read command for the target word line, the at least one special command indicating that a read operation of the target word line is to be executed under an alternative read mode,
    receiving, by a decoder portion, the command sequence;
    determining, by the decoder portion,
        a read voltage for the target word line according to the disturbance status of the target word line and the command sequence, and
        a magnitude of an alternative read voltage according to the command sequence; and
    applying, by the decoder portion, the read voltage to the memory cells of the target word line.

2. The method of claim 1, wherein generating the command sequence includes generating a prefix command as the at least one special command, the prefix command preceding the read command for the target word line.

3. The method of claim 1, wherein generating the command sequence includes generating an enter mode command and an exit mode command as the at least one special command, the enter mode command being arranged before the read command in the command sequence and the exit mode command being arranged after the read command in the command sequence.

4. The method of claim 1, wherein determining the programming state of the neighboring word line includes reading a programmed flag coded in redundant memory cells of the neighboring word line to determine the programming state of the neighboring word line.

5. The method of claim 4, wherein reading the programmed flag includes checking at least one of a number of programmed redundant memory cells or a number of erased redundant memory cells of the neighboring word line.

6. The method of claim 1, wherein:
the semiconductor memory includes a single-bit semiconductor memory, and
determining the programming state of the neighboring word line includes determining whether the neighboring word line has been programmed.

7. The method of claim 1, wherein:
the semiconductor memory includes a two-bit semiconductor memory, and
determining the programming state of the neighboring word line includes determining whether a least significant bit page of the neighboring word line has been programmed and whether a most significant bit page of the neighboring word line has been programmed.

8. The method of claim 1, wherein:
the semiconductor memory further includes a plurality of redundant memory cells associated with the target word line and the neighboring word line, respectively,
the redundant memory cells of each of the target word line and the neighboring word line are divided into at least one erased group and at least one programmed group, the redundant memory cells in the at least one erased group being designed to be in an erased state, the redundant memory cells in the at least one programmed group being designed to be in a programmed state, and the at least one erased group and the at least one programmed group being arranged alternately,
the arrangement of the at least one erased group and the at least one programmed group of the target word line and the arrangement of the at least one erased group and the at least one programmed group of the neighboring word line are in an inverse manner with respect to each other, and
determining the disturbance status of the target word line includes:
reading an actual programming state of a redundant memory cell in the at least one erased group of the target word line; and
determining the disturbance status of the target word line according to the actual programming state of the redundant memory cell in the at least one erased group of the target word line.

9. A semiconductor memory, comprising:
a memory cell area including first memory cells of a target word line and second memory cells of a neighboring word line that is neighboring to the target word line; and
a control portion configured to:
determine a disturbance status of the target word line, the disturbance status reflecting a disturbance of a neighboring word line on the memory cells of the target word line;
determine a programming state of the neighboring word line; and
generate a command sequence including a read command for the target word line and at least one special command associated with the read command for the target word line, the at least one special command indicating that a read operation of the target word line is to be executed under an alternative read mode, a decoder portion configured to:
receive the command sequence;
determine a read voltage for the target word line according to the disturbance status of the target word line and the command sequence;
determine a magnitude of an alternative read voltage according to the command sequence; and
apply the read voltage to the first memory cells.

10. The semiconductor memory of claim 9, wherein the control portion is further configured to:
generate a prefix command as the at least one special command, the prefix command preceding the read command for the target word line.

11. The semiconductor memory of claim 9, wherein the control portion is further configured to:
generate an enter mode command and an exit mode command as the at least one special command, the enter mode command being arranged before the read command in the command sequence and the exit mode command being arranged after the read command in the command sequence.

12. The semiconductor memory of claim 9, wherein the control portion is further configured to:
read a programmed flag coded in redundant memory cells of the neighboring word line to determine the programming state of the neighboring word line.

13. The semiconductor memory of claim 12, wherein the control portion is further configured to:
check at least one of a number of programmed redundant memory cells or a number of erased redundant memory cells of the neighboring word line to determine the programming state of the neighboring word line.

14. The semiconductor memory of claim 9, wherein:
the semiconductor memory includes a single-bit semiconductor memory, and
the control portion is further configured to determine whether the neighboring word line has been programmed.

15. The semiconductor memory of claim 9, wherein:
the semiconductor memory includes a two-bit semiconductor memory, and
the control portion is further configured to determine whether a least significant bit page of the neighboring word line has been programmed and whether a most significant bit page of the neighboring word line has been programmed.

16. The semiconductor memory of claim 9, wherein:
the memory cell area further includes a plurality of redundant memory cells associated with the target word line and the neighboring word line, respectively,
the redundant memory cells of each of the target word line and the neighboring word line are divided into at least one erased group and at least one programmed group, the redundant memory cells in the at least one erased group being designed to be in an erased state, the redundant memory cells in the at least one programmed group being designed to be in a programmed state, and the at least one erased group and the at least one programmed group being arranged alternately,
the arrangement of the at least one erased group and the at least one programmed group of the target word line and the at least one erased group and the arrangement of the at least one programmed group of the neighboring word line are in an inverse manner with respect to each other, and
the control portion is further configured to:
read an actual programming state of a redundant memory cell in the at least one erased group of the target word line; and determine the disturbance status of the target word line according to the actual programming state of the redundant memory cell in the at least one erased group of the target word line.

17. The method of claim 1, wherein:
the semiconductor memory further includes a plurality of redundant memory cells associated with the target word line and the neighboring word line, respectively, and
the redundant memory cells of each of the target word line and the neighboring word line are divided into at least one erased group and at least one programmed group, the redundant memory cells in the at least one erased group being designed to be in an erased state, the redundant memory cells in the at least one programmed group being designed to be in a programmed state, and the at least one erased group and the at least one programmed group being arranged alternately.

* * * * *